United States Patent [19]

Bird et al.

[11] Patent Number: 4,885,477
[45] Date of Patent: Dec. 5, 1989

[54] DIFFERENTIAL AMPLIFIER AND CURRENT SENSING CIRCUIT INCLUDING SUCH AN AMPLIFIER

[75] Inventors: Philip H. Bird, Sidcup; Desmond R. Armstrong, Wallington, both of England

[73] Assignee: U.S. Philips Corporation, New York, N.Y.

[21] Appl. No.: 203,404

[22] Filed: Jun. 6, 1988

[30] Foreign Application Priority Data

Jun. 8, 1987 [GB] United Kingdom ............... 8713387

[51] Int. Cl.⁴ .......................... H03K 3/01; H03F 3/45
[52] U.S. Cl. ................................. 307/296.8; 323/316; 330/253; 330/257
[58] Field of Search ............... 330/253, 257, 307, 288; 307/497, 296.4, 296.6, 296.8; 323/315, 316

[56] References Cited

U.S. PATENT DOCUMENTS 3,947,778  3/1976  Hsiao et al. ..................... 330/253
4,319,181  3/1982  Wrathall ...................... 307/299.3 X
4,553,084  11/1985 Wrathall ......................... 330/257 X

FOREIGN PATENT DOCUMENTS 748800  7/1980  U.S.S.R. ........................... 330/253

OTHER PUBLICATIONS

K. Kurokawa et al., Investigations on Hybrid Computing Elements Using Integrated Circuits, 5th International Computation Meetings, Aug./Sep. 1967, pp. 135-140.

Primary Examiner—James B. Mullins
Attorney, Agent, or Firm—Thomas A. Briody; Jack E. Haken; Jack D. Slobod

[57] ABSTRACT

A differential amplifier includes first and second matched field-effect transistors (FETs) (21,22) having their source electrodes connected together and to a current source (2), and their drain electrodes connected respectively to an input and an output of a current mirror circuit (3). The FETs (21,22) are depletion-mode FETs, and the current source comprises parallel-connected third and fourth depletion-mode FETs (25,26) matched to the first and second FETs (21,22). The current source (2) and current mirror (3) act to constrain the first and second FETs (21,22), to operate over a predetermined operating curve, for which they are optimally matched to one another. The differential amplifier may be constructed as an integrated circuit, and may form part of a circuit for sensing current in a power semiconductor device.

12 Claims, 3 Drawing Sheets

DIFFERENTIAL AMPLIFIER AND CURRENT SENSING CIRCUIT INCLUDING SUCH AN AMPLIFIER

BACKGROUND OF THE INVENTION

1. Field of the Invention

The invention relates to a differential amplifier comprising first and second matched field-effect transistors (FETs) having their source electrodes connected together and to a current source, and their drain electrodes connected respectively to an input and an output of a current mirror circuit.

The invention also relates to a current sensing circuit for sensing an output current of a power semiconductor arrangement, which arrangement has a major and minor current carrying section, each section comprising at least one basic semiconductor element, said major and minor current carrying sections having a common first electrode and corresponding major and minor second electrodes.

The invention still further relates to an integrated circuit including such a current sensing circuit and a power semiconductor arrangment as described in the preceding paragraph.

2. Description of the Prior Art

Such a differential amplifier is disclosed in U.S. Pat. No. 4319181 (see FIG. 3 thereof). Two n-channel field-effect transistors (FETs) connected in the well-known "long-tail pair" configuration to form a differential amplifier. A current mirror formed by two p-channel FETs ensures that the currents in the text areas are equal with balanced inputs. The constant current source acts as a very high resistance in the "tail" of the circuit. A current sensing circuit as set forth in the second paragraph, and also a power semiconductor arrangement as set forth in the third paragraph, are disclosed in EP-A-0139998 and U.S. Pat. No. 4553084.

In a practical embodiment the known power semiconductor arrangement contains a major current-carrying section with a large number of basic semiconductor elements, such as diodes, bipolar and/or field effect transistors and thyristors. The minor current-carrying section has a significantly smaller number of such basic semiconductor elements or only one such basic semiconductor element.

It is also possible for both the major and minor current-carrying sections to contain only one basic semiconductor element, each of which however then has a different construction and/or geometry. This is the case in the cited U.S. Pat. No. 4319181 where the bipolar transistors 11 and 12 each have a lateral minor collector as well as a vertical major collector.

Power semiconductor arrangements may also make provision for several minor current-carrying sections.

In addition, control electrodes of the major and minor current-carrying sections may be connected to each other, either in the semiconductor body, or externally.

In these known power semiconductor arrangements the current level in the minor current-carrying section is assumed to be proportional to the current level in the major current-carrying section, as a result of which the current level in the major current-carrying section can be sensed by an external low power circuit because only a fraction of the output current of the power semiconductor arrangement, i.e., the output current of the minor current-carrying section, need be measured in order to be able to determine the current level in the major current-carrying section.

It has been found, however, that under certain circumstances, for example a difference between the input impedance of the current-sensing circuit and that of the load connected to the semiconductor power arrangement, the output current of the semiconductor power arrangement at the major second electrode and the measuring current at the minor second electrode are not proportional to each other.

For example, in U.S. Pat. No. 4553084, the measuring current passes through a resistance 14 to produce a voltage drop which can be measured. This voltage drop must be very much less than that across the power device, or the minor current-carrying section will be subject to different operating conditions and therefore be unrepresentative of the major current carrying section. In that citation, the voltage drop across the power device is 5 volts under a 10A load, which may be unacceptably high for many applications, for example in 12 v car systems.

Similarly, in U.S. Pat. No. 4319181, the impedance of the load is unlikely to match the impedance of the current mirror transistors 21 and 23, causing the two minor collector currents to be unrepresentative of the main load current.

In known differential amplifiers, it is usually desirable for the characteristics of the two transistors of the long-tail pair to be closely matched. Matching affords greater accuracy, and particularly improved rejection of common-mode signals.

OBJECTS OF THE INVENTION

It is therefore an object of the present invention to enable the provision of a differential amplifier in which the matching of the transistors of the long-tail pair is improved.

Another object of the invention is to enable the provision of an improved current sensing circuit for use with a power semiconductor arrangement as described hereinbefore, in which the operation of the minor current-carrying section may be more accurately representative of the operation of the major current-carrying section.

SUMMARY OF THE INVENTION

The invention provides a differential amplifier as set forth in the opening paragraph comprising first and second matched field-effect transistors (FETs) having their source electrodes connected together and to a current source, and their drain electrodes connected respectively to an input and an output of a current mirror circuit characterised in that said first and second FETs are depletion-mode FETs, and in that said current source comprises parallel-connected third and fourth depletion-mode FETs matched to the first and second FETs, each of the third and fourth FETs having its gate and source electrodes connected together and to a voltage supply, and its drain electrode connected to the source electrodes of the first and second FETs.

The invention is based on the recognition that although matched devices can never be ideally matched, certain sets of operating conditions give better matching than others. By using a pair of devices for the current source which are matched to the devices of the long-tail pair, and further by coupling their gates and sources in a predetermined fashion, not only the devices of the current source but also the devices of the long-tail pair themselves can be constrained to an operating curve for which their transfer characteristics are optimally matched.

For example, if the gates of the third and fourth FETs are held at equal fixed potentials relative to their sources, then, at least for zero differential input, the first and second FETs each pass an equal current, which confines them to the same operating curve (i.e. the same gate-source potential) as the third and fourth FETs.

Each of the third and fourth FETs may have its gate electrode directly connected to its source electrode. This defines a zero gate-source potential ($V_{GS}=0V$) for the third and fourth transistors and hence an equal and characteristic current in each. For a zero differential input, then, the current in each of the first and second FETs is equal to this characteristic current and so each of the first and second FETs is operating at $V_{GS}=0$. Depletion mode metal-oxide-semiconductor FETs (MOSFETs), for example, are optimally matched when $V_{GS}=0$.

The differential amplifier may comprise means for deriving an output signal in the form of a current difference at the junction of the output of the current mirror and the drain electrode of the second FET.

The differential amplifier may further comprise switching means for disconnecting the circuit from its supply when not in operation so as to reduce current consumption. This would be advantageous in battery-powered applications.

The first, second, third and fourth FETs may be integrated on a common substrate. Although it is possible to select matched discrete devices, it is preferable to integrate the FETs, so that as well as having identical geometries, the process variations and operating conditions (e.g. temperature) that affect transistor characteristics will be identical for all four FETs.

The invention further provides a current sensing circuit for sensing an output current of a power semiconductor as set forth in the second paragraph, the current sensing circuit comprising: means for comparing the voltages at the major and minor second electrodes; means for controlling a current drawn from the minor second electrode in response to an output of the comparing means so as to cause the voltage at the minor second electrode to tend to substantial equality with that at the major second electrode; and means for measuring the current drawn from the minor second electrode, wherein the comparing means comprises a differential amplifier in accordance with the invention, means being provided for coupling the gate electrodes of the first and second FETs respectively to the major and minor second electrodes of the power semiconductor arrangement.

A similar current sensing circuit is disclosed in co-pending European Patent Application 86202123.5 corresponding to U.S. Pat. Application Ser. No. 935895 filed Nov. 28, 1986 which was abandoned upon the filing of a continuation on Aug. 19, 1988 under Ser. No. 233,969, the contents of which are incorporated herein by reference. The current sensing circuit ensures that in normal operation both the major and minor second electrodes of a power semiconductor arrangement connected to the circuit are maintained at equal voltages, thereby ensuring that the current in the minor current-carrying section is accurately proportional to the current in the major current-carrying section. The present invention utilises a differential amplifier of a particular construction which gives an improved performance.

The current-controlling means may comprise a further field-effect transistor having its source electrode arranged for connection to the minor second electrode of the power semiconductor arrangement, its gate electrode connected to the output of the differential amplifier and its drain electrode coupled to the current measuring means. The current difference output of the differential amplifier may then charge or discharge the capacitance of the gate of the further FET until the current drawn by that FET from the minor second electrode of a power semiconductor arrangement coupled thereto causes the voltage at that electrode to equal the voltage at the major second electrode.

The means for coupling the gate electrodes of the FETs to the second electrodes of the power semiconductor arrangement may comprise a pair of potential dividers each having the same division ratio. Further, particularly if the current sensing circuit is an integrated circuit, each potential divider may comprise two depletion-mode FETs, each having its gate electrode connected to its source electrode. Potential dividers may be of particular use where the voltages to be compared are too close to one of the supply voltates for the FETs of the differential amplifier to be turned on. It should be noted that it may be necessary to allow for the threshold voltages of the transistors of the current mirror or of the current source, as well as those of the long-tail pair itself.

The current measuring means may include one or more threshold detection circuits, each producing an output dependent on the value of the current being measured relative to a predetermined reference current. Such a threshold detection circuit may include a Schmidt trigger circuit. Threshold detection allows detection of extreme levels of current, which might signify a faulty or short-circuited load, or an open circuit, for example a blown lamp. Such significations could then be used to trigger an alarm, or even to control automatically the operation of the power semiconductor arrangement, for example to provide short-circuit protection.

The current measuring means may comprise one or more current mirror circuits for reproducing and/or rscaling the current to be measured Means may be provided for disabling such a current mirror to reduce current consumption when the current sensing circuit is inoperative. Reproduction of the current to be measured may for example allow more convenient detection of more than one threshold level, or remote monitoring may be desired. Scaling current mirrors may be useful where the current being measured is inconveniently small or large, or to allow more than one threshold to be detected using a single reference current.

The invention further provides an integrated circuit comprising a power semiconductor arrangement having major and minor current carrying sections, each section comprising at least one basic semiconductor element, said major and minor current carrying sections having a common first electrode and corresponding major and minor second electrodes, the integrated circuit further comprising a current sensing circuit according to the present invention. Such an integrated circuit may be used, for example, as part of an intelligent power switch for controlling electrical devices in motor vehicles and similar applications, or it may be used as a variable power supply. In either case the provision of the current sensing circuit enables monitoring of the load current for example for short-circuit or open-circuit detection, or by feedback to provide a constant current or current limiting function.

Such an integrated circuit may comprise means for automatically controlling the power semiconductor arrangement in response to the output of the current sensing circuit. For example detection of a short-circuit may cause the power semiconductor to be switched off automatically, before it (or the load) is damaged by excessive current.

The power semiconductor arrangement may comprise a metal-oxide-semiconductor power transistor (MOST) having a plurality of cells, the major current carrying section comprising a majority of said cells, the cells having a common drain terminal, a common gate terminal and corresponding major and minor source terminals. The cellular structure of power MOSTs lends itself readily to current sensing in accordance with the invention. Typically there may be of the order of ten thousand cells, so for a load current of several amperes, the measuring current might be only of the order of a milliamp or less, which is a convenient range for the low power circuitry.

Embodiments of the invention will now be described, by way of example, with reference to the accompanying drawings, in which:

DETAILED DESCRIPTION OF THE PREFERRED EMBODIMENTS

Figure 1A:
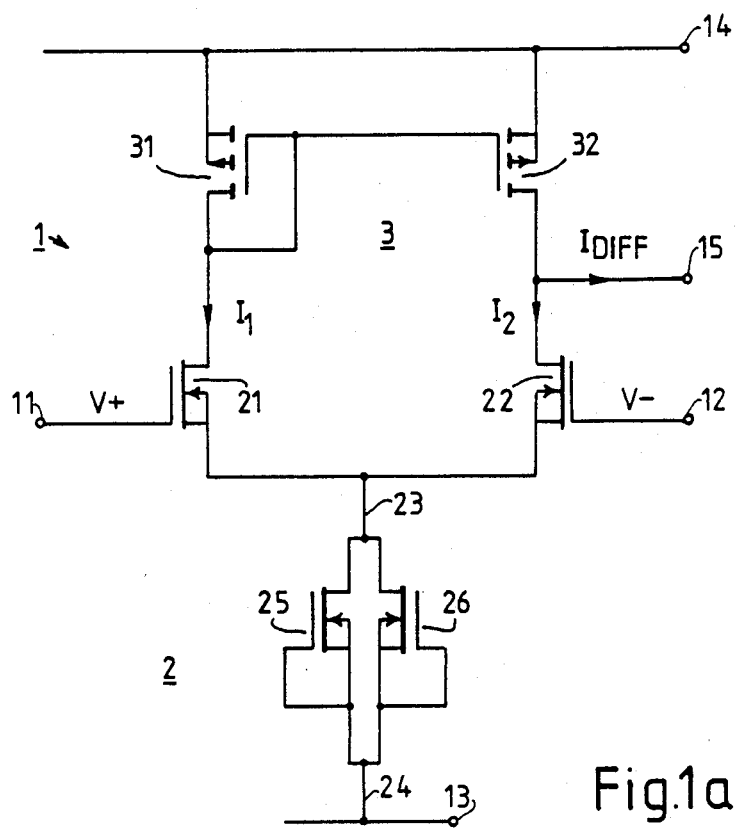
FIG. 1a is a circuit diagram of a differential amplifier in accordance with the invention.

In FIG. 1a, differential amplifier 1 has first and second input terminals 11 and 12, which are connected respectively to the gates of first and second depletion-mode transistors 21 and 22. In this exemplary embodiment, the transistors 21 and 22 are n-channel metal-oxide-semidonductor field effect transistors (MOSFETs), but it will be apparent from the description which follows that other devices may have characteristics suitable for implementing the present invention. Similarly, it will be readily apparent to those skilled in the art that where n-channel devices are described, by way of example, p-channel devices may be used and vice-versa, with due attention to supply voltage polarities, etc.

The sources of MOSFETs 21 and 22 are connected in common to a first terminal 23 of a current source 2, thereby forming a "long-tail pair" arrangement. Current source 2 has a second terminal 24 connected to a first supply terminal 13 which may be earth.

Two p-channel enhancement-mode MOSFETs 31 and 32 are connected so as to form a current mirror circuit 3. The gate of transistor 31 in connected to its drain which, being connected to the drain of transistor 21, forms the input of the current mirror 3. The gate of transistor 32 is connected to the gate and drain of transistor 31. The sources of transistors 31 and 32 are both connected to a second supply terminal 14. The drain of transistor 32 forms the output of the current mirror 3 and is connected to the drain of transistor 22 and to an output terminal 15.

Current source 2 comprises two n-channel depletion-mode MOSFETs 25 and 26, connected in parallel between terminals 23 and 24. The gate and source of each transistor 25 and 26 are directly connected together.

Figure 1B:
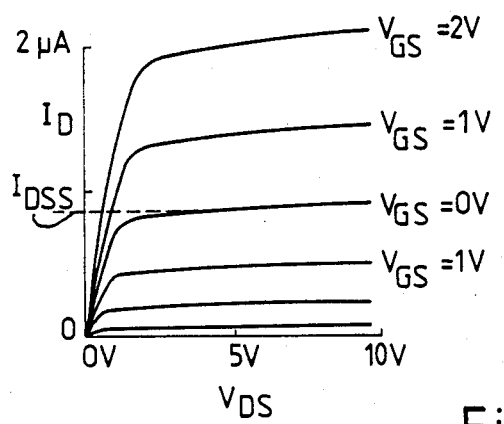
FIG. 1b shows typical characteristics of a depletion-mode metal-oxide-semiconductor field-effect transistor (MOSFET)

In operation, the transistors 21, 22, 25 and 26 are biased into saturation. In accordance with FIG. 1b, they thus act as substantially constant current sources, but modulated by their gate-source voltages, $V_{GS}$. Because the currents in the input and output of the current mirror 3 are constrained to be equal, the output current $I_{DIFF}$ is given by the equation:

$$I_{DIFF} = I_1 - I_2$$

where $I_1$ is the current through transistor 21 and $I_2$ is the current through transistor 22.

$I_{DIFF}$ is therefore controlled by the differential input signal $(V_+ - V_-)$ applied via input terminals 11 and 12 to the gates of transistors 21 and 22. To improve performance, and particularly common-mode rejection, transistors 21 and 22 are matched. This can conveniently be achieved by simultaneous integration of both transistors on a common substrate using identical geometries. In this way, both transistors are subject to identical process and temperature variations, and should therefore perform identically. However, it is known that even matched depletion-mode MOSFETs have their transfer characteristics most accurately matched only around the curve $V_{GS} = 0V$ (see FIG. 1b). To confine the operation of transistors 21 and 22 to this advantageous operating curve in accordance with the invention, the transistors 25 and 26 are matched to one another and also matched to transistors 21 and 22, preferably being integrated alongside. The direct gate-source connection of transistors 25 and 26 defines $V_{GS} = 0$ for each and thus defines the drain current of each to be $I_{DSS}$ (see FIG. 1b). Thus the total bias current $I_S$ is given by $$I_S = I_1 + I_2 = 2 \times I_{DSS}$$

So, for zero differential input, which is usually a good approximation in negative feedback applications, then $I_1 = I_2$. Consequently the current through each of transistors 21 and 22 is $I_{DSS}$, and so their gate-source voltage is zero.

Such a biasing scheme has the added advantage of remaining optimally matched despite variations in operating conditions, such as process and temperature changes because the matched transistors 21, 22, 25, 26 all behave identically in response to such changes.

Of course, for other types of devices, optimum matching may not be for $V_{GS} = 0$, but for some other value. In such cases, the gate-source connection of transistors 25 and 26 need not be direct, but may be via a different reference potential source. For example, one could use the voltage drop across one or more diodes. The diodes may themselves be matched to the transistors so that temperature and process variations may still be compensated.

Figure 2:
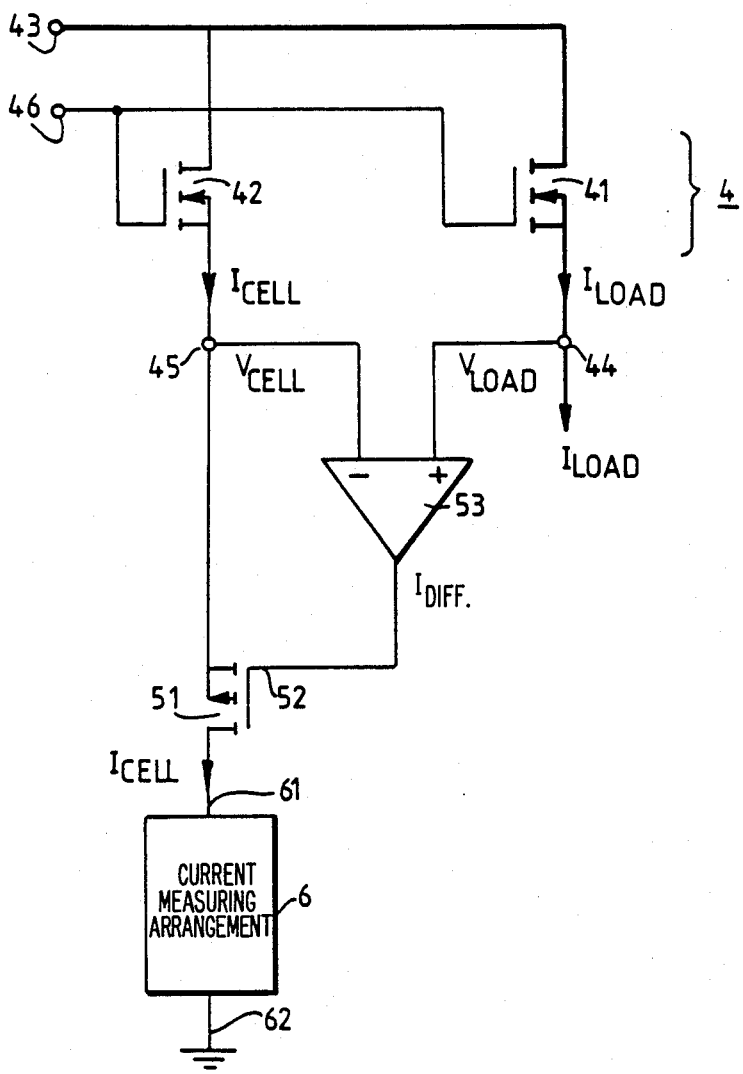
FIG. 2 is a block schematic diagram of a current sensing circuit in accordance with the invention, and an associated power semiconductor arrangement.

FIG. 2 shows a power semiconductor arrangement 4 comprising major and minor portions 41 and 42 respectively. The major and minor portions have a common first terminal 43 and respective major and minor second terminals 44 and 45.

In this particular example, the arrangment 4 is a cellular vertical power MOSFET device. The device may typically contain hundreds or even thousands of cells, all having a common drain electrode which is connected to terminal 43. The majority of the cells are connected in parallel to form the major portion 41 of the arrangement, with their sources connected to terminal 44. One cell (or possibly a few cells) forms the minor current carrying portion 42, having its source electrode connected to terminal 45. In this example, the gate electrodes of both portions are connected to a control terminal 46.

As mentioned already in the introductory part of this specification, power MOSFETs are not the only semiconductor arrangements amenable to current sensing in accordance with the invention, and are shown here merely to provide an example of the application of such a current sensing circuit.

A p-channel MOSFET 51 has its source connected to the minor second terminal 45 and its drain connected to the input 61 of a current measuring arrangement 6. The arrangement 6 is shown, for the sake of example, as being connected to earth at 62, but any appropriate supply voltage level may be used, as will be clear from an understanding of the following description.

The gate 52 of transistor 51 is connected to the output of a differential amplifier 53, constructed in accordance with the invention. The inverting input (−) of the amplifier 53 is connected to the minor second terminal 45 of the semiconductor arrangement 4 and the non-inverting (+) input of the amplifier 53 is connected to the major second terminal 44 of the arrangement 4.

In operation, the main body of current, $I_{LOAD}$ flows from a supply connected to terminal 43 through the arrangement 4 and out through terminal 44 to a load (not shown). The load may for example be a lamp, or a motor winding. The flow of current $I_{LOAD}$ may be controlled by signals applied to control terminal 46, because of the transistor action of the major portion 41 of the MOSFET arrangement 4.

The differential amplifier 53 drives the MOSFET 51 so as to cause it to draw a current $I_{CELL}$ from the minor second terminal 45 of the power semiconductor arrangement 4. The feedback action of the amplifier 53 and MOSFET 51 causes the voltage $V_{CELL}$ at terminal 45 to be held equal to the voltage $V_{LOAD}$ at terminal 44. Thus, in the example MOSFET arrangement 4 shown, the current $I_{CELL}$ in the minor portion 42 of the arrangement 4 is accurately in proportion to the current $I_{LOAD}$. Therefore current measuring arrangement 6, which may as a simple example be a milliammeter, enables an accurate measurement of the load current $I_{LOAD}$, without the need to insert series resistances or the like into the major current path.

In the cellular MOSFET arrangement described previously, calculation of $I_{LOAD}$ is particularly simple since the ratio of the measured $I_{CELL}$ to $I_{LOAD}$ is simply the ratio of the numbers of cells in the respective portions 42 and 41, to a good approximation. As a particular example, if the arrangement 4 were a cellular MOSFET as shown, with 8000 cells in the major current-carrying portion 41 and just one cell in the minor portion 42, then a measured current $I_{CELL}$ of 0.125 milliamperes (mA) would indicate an output current $I_{LOAD}$ of 1 ampere (A). Similarly a measured current of 0.75 mA indicates an output of 6A, and so forth. If the arrangement 4 has a different construction to that described, for example different sizes or geometries for its two portions 41 and 42, then a more complex calculation may be required to derive the constant of proportionaliity, but once that constant is found, the measurement may be equally simple and accurate.

In a typical application, such as an intelligent power switch in a motor vehicle, the circuit of FIG. 2 may replace a conventional dashboard switch or a relay, for controlling a headlamp, for example. In such an application, terminal 43 is connected to the battery supply rail (+12 volts, for example) of the vehicle, and earth connection 62 becomes the chassis earth of the vehicle. The polarities of the components shown in FIG. 2 are those suitable for a negative earth system. Terminal 44 is connected to the load, such as a headlamp bulb, which has a return connection to earth 62.

Figure 3:
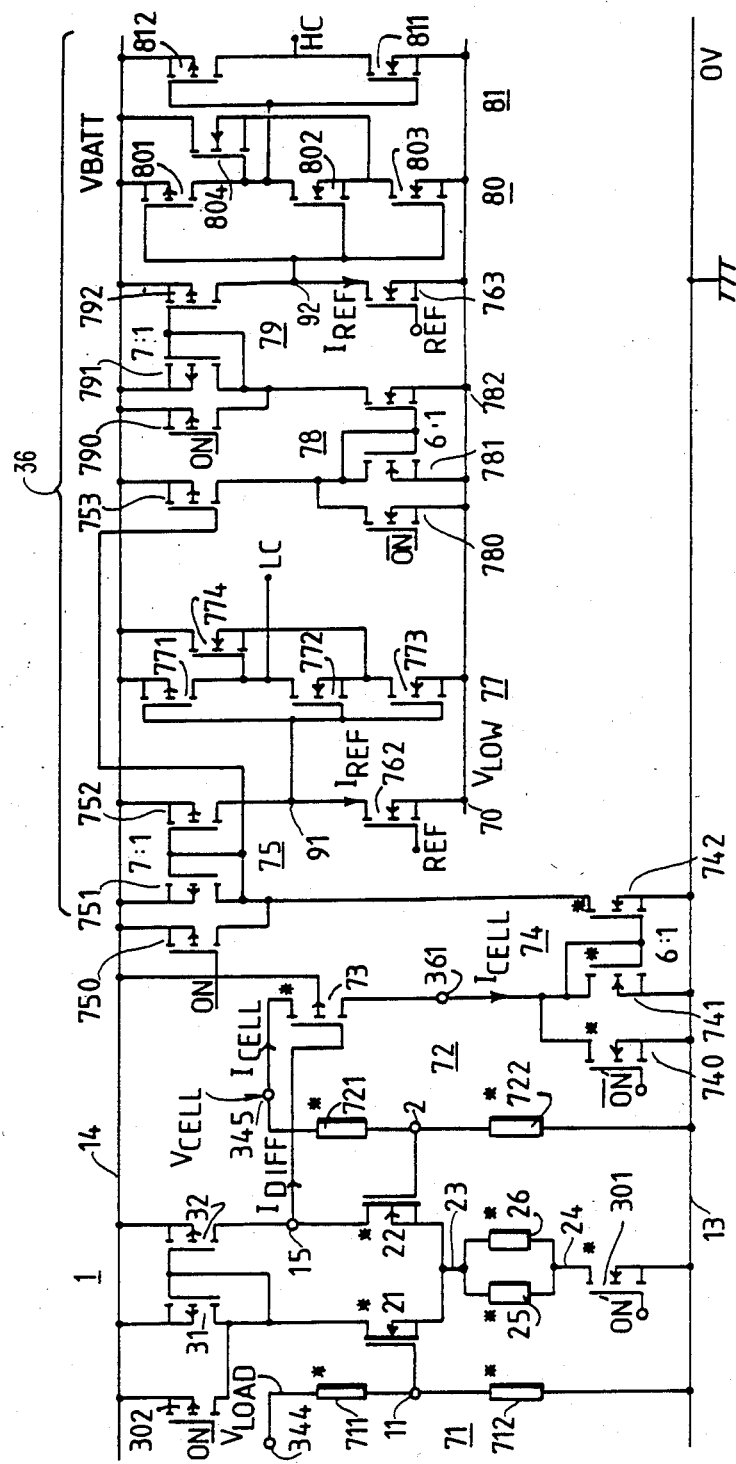
FIG. 3 is a more detailed circuit diagram of the current sensing circuit of FIG. 2.

FIG. 3 shows in more detail a current sensing circuit similar to that in FIG. 2. The circuit is suitable for inclusion in an intelligent power switch for use in a motor vehicle, and will be described in that application as a practical example. Other fields of application will be apparent to those skilled in the art.

A differential amplifier 1, is constructed in accordance with the embodiment of the invention described previously with reference to FIG. 1, and shown using the same reference signs 11–32 as used in that earlier description. The gate-source connected depletion-mode MOSFETs are shown as parallel resistance devices 25 and 26, to illustrate their function, but they remain identical to MOSFETs 21 and 22 as before. An additional n-channel enhancement-mode MOSFET 301 is connected in series with the devices 25 and 26. The function of additional transistor 301 will be explained later, but in normal operation it simply provides a direct connection between resistance devices 25 and 26 and supply rail 13, as shown in FIG. 1a.

Input terminals 344 and 345 are provided for connection to the major and minor second terminals respectively of a power semiconductor arrangement such as that described previously with reference to FIG. 2. The power semiconductor arrangement itself is not shown, for reasons of space. Terminals 344 and 345 are coupled to to input terminals 11 and 12 respectively of the differential amplifier 1 by means of two potential dividers, 71 and 72. Divider 71 (and similarly divider 72) comprises a pair of resistance devices 711 and 712 (721 and 722). In a preferred embodiment, suitable for construction as an integrated circuit, the devices 711, 712 and 721, 722 are MOS load devices, such as depletion-mode MOSFETs having their gate and source electrodes connected in a similar fashion to MOSFETs 25 and 26.

The division ratios of dividers 71 and 72 are made equal by suitable choice of devices 711, 712 and 721, 722. One end of each of devices 712 and 722 is connected to supply rail 13. The common node of current mirror 3 is connected to a second supply rail 14.

A p-channel MOSFET 73 has its source connected to input terminal 345 and its gate connected to the output terminal 15 of the amplifier 1. The drain of MOSFET 73 is connected at 361 to to the input of a current mirror 74 comprising n-channel MOSFETs 741 and 742. Terminal 361 forms the input of a current measuring circuit 36 which is analogous to arrangement 6 in FIG. 2. The operation of current measuring circuit 36, which includes all the parts shown to the right of current mirror 74, will be described later.

In operation, supply rail 14 is the battery supply rail, $V_{BATT}$, of the motor vehicle and supply rail 13 is the chassis earth, OV, in a negative earth system such as that described previously with reference to FIG. 2.

To protect against high voltage spikes which often occur in vehicle electrical systems, all devices marked with an asterisk (*) are constructed as high voltage devices. Other parts of the circuit, such as current mirror 3 and the current measuring circuit 36, may be constructed using conventional complementary MOS (CMOS) devices, because of the provision of a third supply rail 70. Supply rail 70 is held, by a regulator not shown, at a supply voltage $V_{LOW}$, which is below $V_{BATT}$ by an amount suitable for the operation of the CMOS circuit 36. ($V_{BATT}$-$V_{LOW}$) may be 5 to 12 volts, depending on a convenient choice of regulator. By operating the low voltage circuitry relative to $V_{BATT}$, and not relative to ground (OV), the circuit is more suitable for integration with the power semiconductor arrangement itself, avoiding the need for high voltage isolation around the low voltage circuitry. This technique is disclosed more fully in co-pending UK Patent Application PHB3336 corresponding to U.S. Ser. No. 203,407, filed June 6, 1988.

When the power arrangment is turned on (e.g. to light a headlamp) the terminals 344 and 345 rise almost to $V_{BATT}$. The potential dividers 71 and 72 drop these voltages to levels suitable for applying to the inputs 11 and 12 of the differential amplifier 1. There must be sufficient voltage difference between each input, 11 and 12 and $V_{BATT}$ to allow the MOSFETs 31 and 32 of the current mirror 3 to enter saturation. The differential amplifier 1 can thus operate to compare $V_{CELL}$ and $V_{LOAD}$ as described earlier with reference to FIGS. 1a, 1b and 2. Analagously to the circuit of FIG. 2, the output 15 of the differential amplifier 1 is connected directly to the gate of the current controlling transistor 73 (51 in FIG. 2). The output signal at 15 is a current difference $I_{DIFF}$ as explained earlier with reference to FIG. 1. This current $I_{DIFF}$ charges or discharges the gate effective capacitance of transistor 73. Thus $I_{DIFF}$ controls the gate voltage of transistor 73, which in turn controls the current $I_{CELL}$ drawn from the minor portion of the power semiconductor arrangement (not shown in FIG. 3).

In the current measuring circuit 36, current mirror 74, comprising transistors 741 and 742, reproduces the measuring current $I_{CELL}$, and scales it by a predetermined ratio. Scaling may be achieved in a well-known manner by constructing transistors 741 and 742 so as to have different channel dimensions, and in this embodiment, the ratio of the currents through transistors 741 and 742 is 6:1. The measuring circuit 36 further includes current mirrors 75. 78 and 79, comprising transistors 751–753, 781–782 and 791–792 respectively, and each having its own predetermined scaling ratio. In this embodient, the scaling ratio of the current mirrors 75, 78 and 79 are 7:1, 6:1 and 7:1 respectively. The circuit 36 further includes Schmidt trigger circuits 77 and 80, which comprise transistors 771–774 and 801–804 respectively.

Reference current sources are provided in the form of transistors 762 and 763, which are typically both output transistors of a current mirror, whose input transistor is not shown, but is connected to transistors 762 and 763 at REF. Each operates to pass a reference current $I_{REF}$, which is shown as equal for both transistors 762 and 763. These reference currents could be made different, if desired, by use of different scaling ratios in the transistors 762 and 763, or by having two separate REF terminals, each transistor 761, 762 then being part of a different current mirror. In this preferred embodiment, however, the use of scaling current mirrors 74, 75, 78 and 79 allows two different thresholds to be detected by use of the single reference current, $I_{REF}$, as explained hereinafter.

At node 91, current $I_{REF}$ is subtracted from the scaled replica of measuring current $I_{CELL}$ generated by current mirror 75. If the scaled $I_{CELL}$ is greater than $I_{REF}$, positive charge flows into the input of Schmitt trigger 77, turning on transistors 772 and 773 while turning off transistor 771 so that output LC is low (logic '0'). If, however, the scaled $I_{CELL}$ is less than $I_{REF}$, then the situation is reversed and LC='1'. Output LC therefore takes a logic value '1' when the current being sensed ($I_{LOAD}$) is below a certain threshold, which threshold is simply determined as the product of the ratio $I_{CELL}$:$I_{LOAD}$ and the ratios 1:6 and 1:7 for the current mirrors 74, 75, multiplied by the reference current $I_{REF}$ Transistor 774 generates the hysteresis action of the Schmitt trigger 77 in a known fashion. Hysteresis improves noise immunity and eliminates oscillation in threshold detection circuits.

Transistor 753 provides a second output for current mirror 75, and hence a further scaled replica of measuring current $I_{CELL}$. The scaling ratio for this second output transistor 753 may be different to that for the first output transistor 752, but in this embodiment it is the same (7:1). At node 92, current $I_{REF}$ is subtracted from this further scaled replica of $I_{CELL}$. If the scaled $I_{CELL}$ is greater than $I_{REF}$, positive charge flows into the input of Schmitt trigger 80, turning on transistors 802 and 803 while turning off transistor 801. Transistor 804 provides a hysteresis characteristic similarly to transistor 774 in trigger circuit 77. The output of trigger 80 drives transistors 811 and 812, which form a simple CMOS inverter circuit 81, driving output 'HC'. Because of the inverter 81, output HC takes a value '1' when $I_{LOAD}$ is higher than the appropriate threshold.

Thus, by suitable choice of $I_{REF}$ and of the ratios m:n for all the current mirror circuits, LC='1' may signal to an external circuit that the load current is too low, perhaps as a result of a fused lamp, while HC='1' may signal that the load current is too high - perhaps indicating a short circuit. HC may be used by another circuit to shut off the power arrangement automatically until the fault is cleared.

In this particular embodiment, where the ratios of current mirrors 78 and 79 are 6:1 and 7:1 respectively, the threshold value of $I_{CELL}$ (and hence of $I_{LOAD}$) being detected at node 92 is approximately forty times higher than that detected by trigger 77 at 91. Thus, for this embodiment, if the low current threshold at node 92 which indicates an open circuit corresponds to 5% of the nominal load current, then the current threshold at node 92 which indicates an excessive load current will correspond to twice the nominal load current. For these exemplary values, for a nominal load current of 6A and where $I_{LOAD}$:$I_{CELL}$ is 8000:1, the required reference current $I_{REF}$ will be approximately 0.9 microamp.

Clearly, any number of replicas of the measuring current may be provided, for example to detect many different threshold levels, or perhaps to provide an analogue display of current. Analogue feedback to the power arrangement could be used to provide a constant current or current limiting function. These and other modifications will be readily apparent to those skilled in the art and may freely be chosen to suit the particular application.

Finally, because the motor vehicle application described is battery powered, and because it is normal to expect the battery to retain its charge even after many weeks of disuse, the circuit of FIG. 3 is provided with power conservation features as follows. Extra transistors 302, 740, 750, 780, 790 are provided to turn off their respective current mirror circuits 3, 74, 75, 78. 79. etc. when logic signal ON has value '0' (equivalent signal ON' being provided at different signal levels for the high voltage portions of the circuit). This signal is generated as a complementary pair ON/$\overline{ON}$, according to the state of the power switch, by means not shown. Transistor 301 is also provided to disconnect the current source 25/26 of the differential amplifier 1 from supply rail 13 when ON='0'. In this way, current consumption in the "off" state can be minimised so as to be only a few microamperes for the complete power switch.

With an intelligent power switch circuit such as that described above it is possible to provide not only the simple power switch function, but also fault detection and protection against costly damage. These functions, and others, may conveniently be integrated upon a single chip. Such a power switch may also be provided with on-chip temperature protection, surge protection and other functions as desired.

From reading the present disclosure, other modifications will be apparent to persons skilled in the art. Such modifications may involve other features which are already known in the design and use of differential amplifiers, current sensing circuits and power semiconductor devices, and component parts thereof, and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation of one or more of those features which would be obvious to persons skilled in the art, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A differential amplifier comprising first and second matched field-effect transistors (FETs) having their source electrodes connected together and to a current source, and their drain electrodes connected respectively to an input and an output of a current mirror circuit, the junction of the output of the current mirror circuit and the drain electrode of the second FET forming a top bar output current of the differential amplifier, characterised in that said first and second FETs are depletion-mode FETs, and in that said current source comprises parallel-connected third and fourth depletion-mode FETs matched to the first and second FETs, each of the third and fourth FETs having its gate and source electrodes connected together and to a voltage supply, and its drain electrode connected to the source electrodes of the first and second FETs.

2. A differential amplifier as claimed in claim 1 comprising switching means for turning off the current mirror circuit from its supply when not in operation so as to reduce current consumption.

3. A differential amplifier as claimed in claim 1 wherein the first, second, third and fourth FETs are integrated on a common substrate.

4. A differential amplifier as claimed in claim 1 or claim 3 wherein the first, second, third and fourth FETs are depletion-mode metal-oxide-semiconductor FETs.

5. A current sensing circuit for sensing an output current of a power semiconductor arrangement, which arrangement has major and minor current carrying sections, each section comprising at least one basic semiconductor element, said major and minor current carrying sections having a common first electrode and corresponding major and minor second electrodes, the current sensing circuit comprising:

means for comparing the voltages at the major and minor second electrodes; means for controlling a current drawn from the minor second electrode in response to an output of the comparing means so as to cause the voltage at the minor second electrode to end to substantial equality with that at the major second electrode; and means for measuring the current drawn from the minor second electrode, wherein the comparing means comprises a differential amplifier comprising first and second matched field-effect transistors (FETs) having their source electrodes connected together and to a current source, and their drain electrodes connected respectively to an input and an output of a current mirror circuit, the junction of the output of the current mirror circuit and the drain electrode of the second FET forming a tap for output current of the differential amplifier, characterized in that said first and second FETs are depletion-mode FETs, and in that said current source comprises parallel-connected third and fourth depletion-mode FETs matched to the first and second FETs, each of the third and fourth FETs having its gate and source electrodes connected together and to a voltage supply, and its drain electrode connected to the source electrodes of the first and second FETs, means being provided for coupling the gate electrodes of the first and second FETs respectively to the major and minor second electrodes of the power semiconductor arrangement.

6. A current sensing circuit as claimed in claim 5 wherein the current controlling means comprises a further field-effect transistor having its source electrode arranged for connection to the minor second electrode of the power semiconductor arrangement, its gate electrode connected to the output of the differential amplifier and its drain electrode coupled to the current measuring means.

7. A current sensing circuit as claimed in claim 5, wherein the means for coupling the gate electrodes of the first and second FETs to the second electrodes of the power semiconductor arrangement comprise a pair of potential dividers, each having the same division ratio, each potential divider comprising two depletion-mode FETs, each having its gate electrode connected to its source electrode.

8. A current sensing circuit as claimed in any of claims 5 to 7, wherein said current measuring means includes a threshold detection circuit producing an output signal dependent on the value of the current being measured relative to a predetermined reference level.

9. A current sensing circuit as claimed in any of claims 5 to 7, wherein the current measuring means includes a current mirror means for the current to be measured.

10. A current sensing circuit as claimed in claim 9 wherein means are provided for disabling said current mirror means to reduce current consumption when the current sensing circuit is inoperative.

11. An integrated circuit comprising a power semiconductor arrangement having major and minor current carrying sections, each section comprising at least one basic semiconductor element, said major and minor current carrying sections having a common first electrode and corresponding major and minor second electrodes and a current sensing circuit comprising means for comparing the voltages at the major and minor second electrodes; means for controlling a current drawn from the minor second electrode in response to an output of the comparing means so as to cause the voltage at the minor second electrode to tend to substantial equality with that at the major second electrode; and means for measuring the current drawn from the minor second electrode, wherein the comparing means comprises a differential amplifier comprising first and second matched field-effect transistors (FETs) having their source electrodes connected together and to a current source, their gate electrodes coupled respectively to said major and minor second electrodes, and their drain electrodes connected respectively to an input and an output of a current mirror circuit, the junction of the output of the current mirror circuit and the drain electrode of the second FET forming a tap for output current of the differential amplifier, characterized in that said first and second FETs are depletion-mode FETs, and in that said current source comprises parallel-connected third and fourth depletion-mode FETs matched to the first and second FETs, each of the third and fourth FETs having its gate and source electrodes connected together and to a voltage supply, and its drain electrode connected to the source electrodes of the first and second FETs.

12. A integrated circuit as claimed in claim 11, in which the power semiconductor arrangement comprises a metal-oxide-semiconductor power transistor having a plurality of cells having a common drain terminal comprising said common first electrode, and a common gate terminal, the major current carrying section comprising a majority of said cells having a common major source terminal comprising said major second electrode, and the minor current carrying section comprising at least one of said cells having a minor source terminal comprising said minor second electrode.

* * * * *